(12) United States Patent
Lai

(10) Patent No.: US 12,477,693 B2
(45) Date of Patent: Nov. 18, 2025

(54) HEAT DISSIPATION ASSEMBLY AND ELECTRIC DEVICE THEREOF

(71) Applicant: GIGA-BYTE TECHNOLOGY CO., LTD., New Taipei (TW)

(72) Inventor: Chih-Ming Lai, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 313 days.

(21) Appl. No.: 18/476,292

(22) Filed: Sep. 27, 2023

(65) Prior Publication Data

US 2024/0224470 A1 Jul. 4, 2024

(30) Foreign Application Priority Data

Dec. 30, 2022 (TW) .................................. 111151011

(51) Int. Cl.
*H05K 7/20* (2006.01)
*H05K 1/02* (2006.01)

(52) U.S. Cl.
CPC ......... *H05K 7/2039* (2013.01); *H05K 1/0203* (2013.01); *H05K 2201/2072* (2013.01)

(58) Field of Classification Search
CPC ............ H01L 23/4093; H01L 23/4006; H01L 2023/4075; H01L 2023/4081; H01L 2023/4087; H01L 23/40; H05K 7/1069; H05K 7/2049; H05K 3/326; H05K 2201/1031; H05K 7/2039; H05K 1/0203
See application file for complete search history.

(56) References Cited

U.S. PATENT DOCUMENTS

| 6,195,880 | B1* | 3/2001 | Hinshaw | H01L 23/4093 |
| | | | | 439/485 |
| 8,902,580 | B2* | 12/2014 | Zhou | H01L 23/36 |
| | | | | 248/346.03 |
| 9,169,859 | B2* | 10/2015 | Lin | F16B 43/025 |
| 10,394,291 | B2* | 8/2019 | Kho | H05K 1/117 |
| 2004/0156171 | A1* | 8/2004 | Dong | H01L 23/4093 |
| | | | | 257/E23.086 |
| 2008/0130233 | A1* | 6/2008 | Jin | H01L 23/4006 |
| | | | | 361/704 |

(Continued)

FOREIGN PATENT DOCUMENTS

TW M631263 U 8/2022

*Primary Examiner* — Adam B Dravininkas
(74) *Attorney, Agent, or Firm* — Idea Intellectual Limited; Sam T. Yip

(57) ABSTRACT

A heat dissipation assembly and an electric device thereof are provided. An expansion card is fixed in the electric device. The heat dissipation assembly includes a heat dissipation unit and a quick release hook. A first guide block is provided on a first side of the heat dissipation unit, and a first positioning component is provided on the first guide block. The quick release hook includes a slide piece, a pressing component and a spring component. The slide piece includes a buckle slot and a first oblong hole. The first positioning component penetrates the first oblong hole and is provided on the first guide block, such that the slide piece is arranged on the first guide block. The spring component is compressed, a second end of the spring component abuts against the first side; and the spring component is released, the buckle slot abuts against a positioning column.

12 Claims, 21 Drawing Sheets

(56) References Cited

U.S. PATENT DOCUMENTS

| | | | |
|---|---|---|---|
| 2011/0170265 A1* | 7/2011 | Lai ...................... | H01L 23/4093 |
| | | | 361/709 |
| 2014/0022753 A1* | 1/2014 | Fu .......................... | G06F 1/186 |
| | | | 361/807 |
| 2023/0077315 A1* | 3/2023 | Peng .................... | H05K 1/0203 |

* cited by examiner

HEAT DISSIPATION ASSEMBLY AND ELECTRIC DEVICE THEREOF

CROSS-REFERENCE TO RELATED APPLICATION

This non-provisional application claims priority under 35 U.S.C. § 119(a) to patent application Ser. No. 11/151,011 in Taiwan, R.O.C. on Dec. 30, 2022, the entire contents of which are hereby incorporated by reference.

BACKGROUND

Technical Field

This application relates to a hook and an electric device applying the same, and in particular to, a heat dissipation assembly and an electric device therefor.

Related Art

With the rapid development of semiconductor technology, in addition to the rapid improvement of the computing power of electric devices, the size of electric devices is also more mini. Since personal computers are more mini, storage devices or expansion devices also introduce communication interfaces that conform to the corresponding size, such as mSATA (mini-SATA) interface, mini PCI-E (mini PCI Express) interface or M.2 interface (or NGFF (Next Generation Form Factor) interface).

In general, an expansion card of the M.2 interface needs to be fixed in a main board in a locked manner. Due to the specification of the expansion card of the M.2 interface, it is necessary to lock the M.2 expansion card on the main board with smaller screws. For users, it is inconvenient to lock the screw to the M.2 expansion card in the limited space of the personal computer. In particular, the limited internal space of the personal computer and the layout of other lines will also affect the locking operation of the user. If the screw is not properly installed on the M.2 expansion card, the screw may be loosened, leading to a short circuit caused by the contact of the screw with other components of the main board.

SUMMARY

In view of this, in some embodiments, a heat dissipation assembly with a quick release hook enables the user to quickly install an expansion card to a main board, and the user can fix the expansion card to the main board without additional tools. The heat dissipation assembly includes a heat dissipation unit and a quick release hook. The heat dissipation unit is arranged in the quick release hook. A first guide block is provided on a first side of the heat dissipation unit, and a positioning component is provided on the first guide block; and the quick release hook includes a slide piece, a pressing component and a spring component, the slide piece includes a buckle slot and a first oblong hole, and the first positioning component penetrates the first oblong hole and is provided on the first guide block, such that the slide piece is arranged on the first guide block, and the pressing component is protruding on the slide piece; the spring component includes a first end and a second end, the first end is provided on the slide piece or the pressing component, and the second end extends from the first end to the first side; and the first guide block moves between a first position and a second position of the first oblong hole, the first guide block is located at the first position, the buckle slot abuts against a positioning column, the first guide block is located at the second position, and the second end of the spring component abuts against the first side. The user can lock and fix the heat dissipation assembly and the expansion card on the main board without using other tools. In addition to avoiding the screw falling into the main board during the locking process, it can also ensure that the quick release hook can fix the expansion card on the main board.

In some embodiments, the spring component is a tongue, a spring or a sponge.

In some embodiments, an accommodating hole is provided in the first side, at least two fixed contacts are provided on a second side of the pressing component, the first end is fixed on the fixed contacts, and the second end is accommodated in the accommodating hole.

In some embodiments, the buckle slot is provided on a first edge of the slide piece, the pressing component is provided on a second edge of the slide piece, and the first edge and the second edge are opposite to each other.

In some embodiments, a second guide block is provided in the first side, a second positioning component is provided on the second guide block, and the second positioning component penetrates a second oblong hole and is provided on the second guide block.

In some embodiments, the first guide block and the second guide block are parallel to each other.

In some embodiments, an electric device is suitable for installing an expansion card with a heat dissipation assembly. The electric device includes a main board and the expansion card. The main board includes an expansion slot and a positioning column; a heat dissipation unit is provided on the expansion card, a first guide block is provided in a first side of the heat dissipation unit, and a first positioning component is provided on the first guide block; a quick release hook includes a slide piece, a pressing component and a spring component, the slide piece includes a buckle slot and a first oblong hole, the first positioning component penetrates the first oblong hole and is provided on the first guide block, such that the slide piece is configured in the first guide block, and the pressing component is protruding on the slide piece; the spring component includes a first end and a second end, the first end is provided on the slide piece or the pressing component, and the second end extends from the first end to the first side; and the first guide block moves between a first position and a second position of the first oblong hole, the first guide block is located in the first position, the buckle slot abuts against a positioning column, the first guide block is located in the second position, and the second end of the spring component abuts against the first side.

In some embodiments, the spring component is a tongue, a spring or a sponge.

In some embodiments, an accommodating hole is provided in the first side, at least two fixed contacts are provided on a second side of the pressing component, the first end is fixed to the fixed contact, and the second end is accommodated in the accommodating hole.

In some embodiments, a second guide block is provided on the first side, a second positioning component is provided on the second guide block, the first guide block and the second guide block are parallel to each other, and the second positioning component penetrates a second oblong hole and is provided on the second guide block.

In some embodiments, two opposite inner edges of the buckle slot each are provided with an inner side plate, one inner side plate is located on an inner side of the first guide block, the other inner side plate is located on an inner side of the second guide block, and the inner side of the first guide block is opposite to the inner side of the second guide block.

The heat dissipation assembly with a quick release hook and the electric device provide a heat dissipation hook free of screw locking. Through the compression and release of the elastic potential energy of the quick release hook and the movement of the slide piece, the expansion card can be avoided from loosening when abutting against the positioning column.

DETAILED DESCRIPTION

Figure 1:
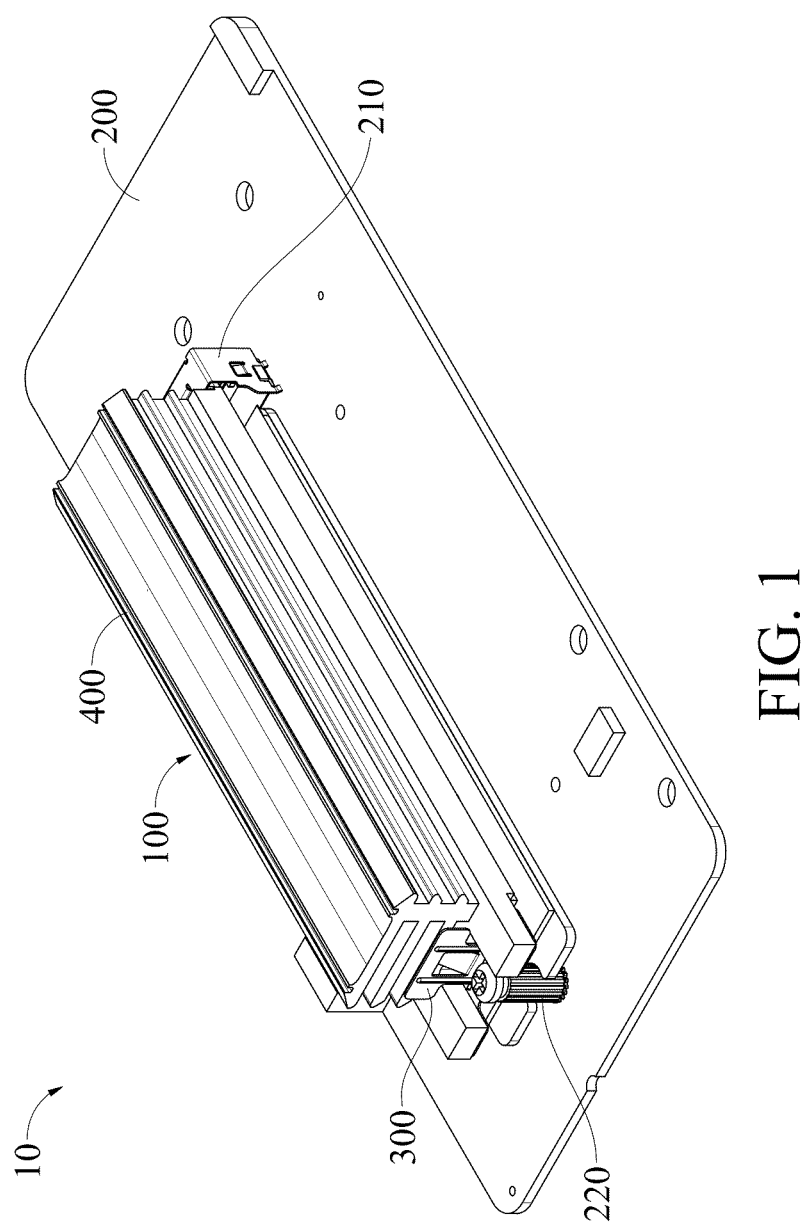
FIG. 1 is a three-dimensional view of an expansion card installed on a main board of an embodiment.
Figure 2:
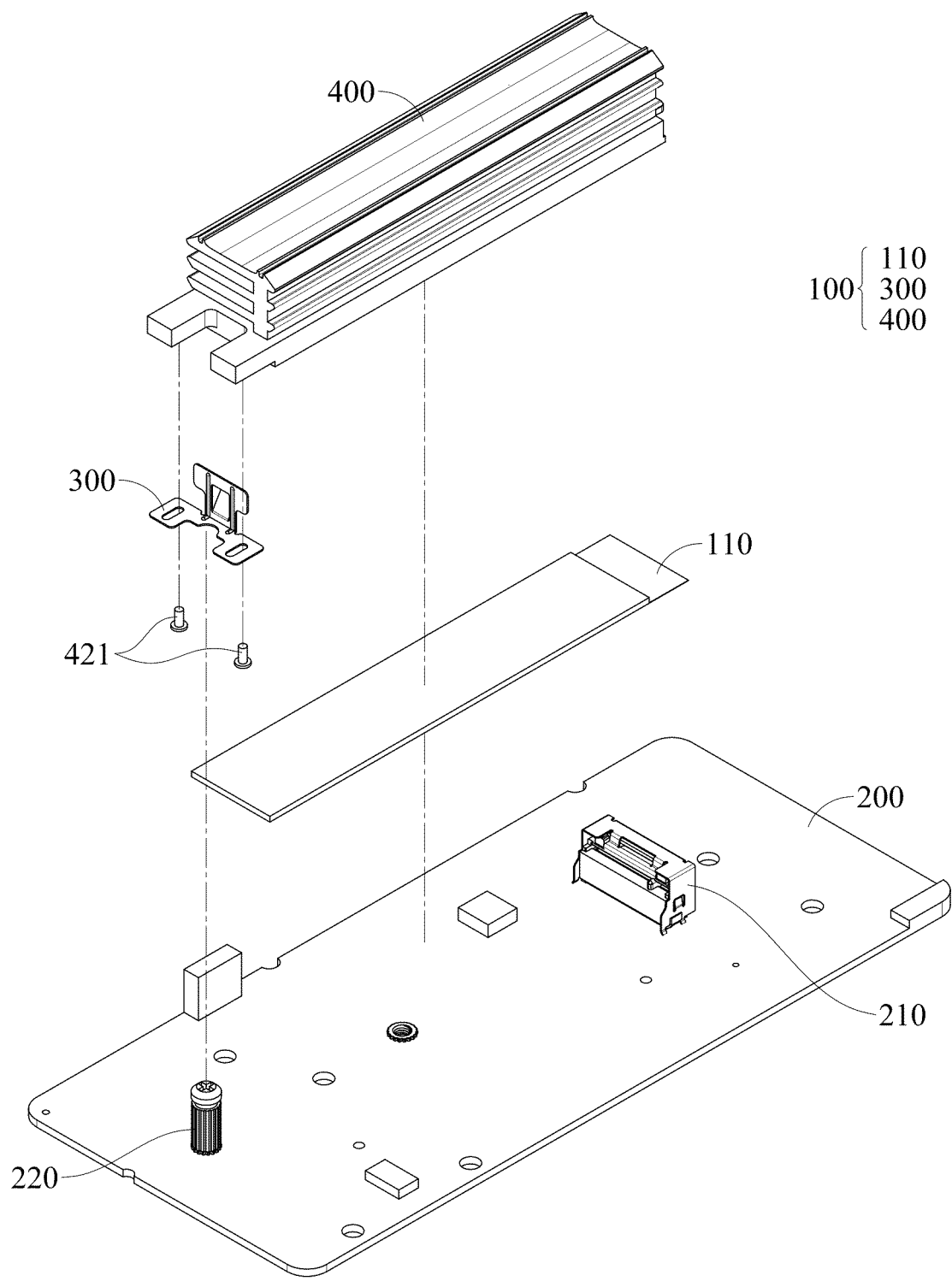
FIG. 2 is a three-dimensional exploded view of an electric device of an embodiment.
Figure 3:
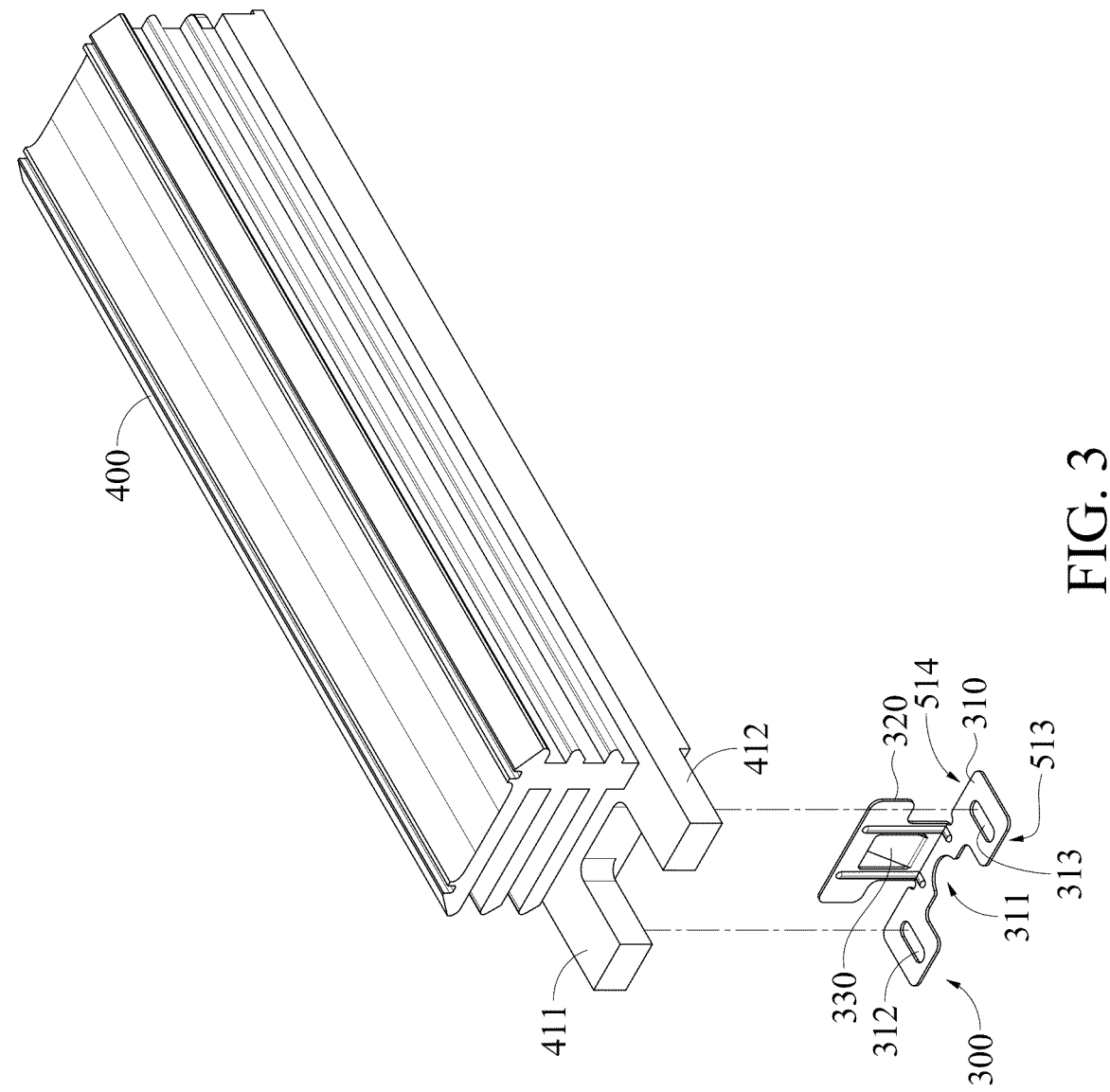
FIG. 3 is a three-dimensional view of a quick release hook and a heat dissipation unit of an embodiment.

Referring to FIG. 1, FIG. 2 and FIG. 3, the electric device 10 includes an expansion card 100 and a main board 200. The main board 200 includes an expansion slot 210 and a positioning column 220. The main board 200 may be, but is not limited to, the main board 200 of a computer, may also be the main board 200 of a mobile device, or a circuit board 110 of peripheral expansion, such as a PCI-e expansion card. The connection interface of the expansion slot 210 corresponds to the communication interface of the expansion card 100. FIG. 1 is a three-dimensional view of an expansion card 100 installed on a main board 200 of an embodiment. When the expansion card 100 is installed on the expansion slot 210, one end of the expansion card 100 is electrically connected to the expansion slot 210, and the other end of the expansion card 100 abuts against the positioning column 220. The type of the expansion card 100 may be, but is not limited to, an M.2 board, a mSATA board, a mini-PCI-E board, or a non-volatile memory express (Non-Volatile Memory Express, NVMe for short) board. The position of the positioning column 220 is determined according to the type of the expansion card 100. The positioning column 220 is locked on a stud.

The expansion card 100 includes a circuit board 110, a quick release hook 300 and a heat dissipation unit 400. The circuit board 110 may be provided on the heat dissipation unit 400, or locked and fixed to a bottom surface of the heat dissipation unit 400. In FIG. 2, the circuit board 110 is provided between the heat dissipation unit 400 and the main board 200. The heat dissipation unit 400 includes a first guide block 411 and a second guide block 412. The first guide block 411 and the second guide block 412 are respectively provided on a first side 511 of the heat dissipation unit 400. The first side 511 of the heat dissipation unit 400 is a side opposite to the positioning column 220. An accommodating area (unlabeled) is formed between the first guide block 411 and the second guide block 412, and a pressing component 320 of the quick release hook 300 may be arranged in the accommodating area.

The quick release hook 300 includes a slide piece 310, the pressing component 320 and a spring component 330. The slide piece 310 includes a first edge 513, a second edge 514 and two oblong holes. A buckle slot 311 is provided on the first edge 513 of the slide piece 310, and the buckle slot 311 is used for abutting against the positioning column 220. A width of the buckle slot 311 is at least greater than a diameter of the positioning column 220. In other words, a distance between the two opposite inner sides of the first guide block 411 and the second guide block 412 is greater than or equal to a width of the buckle slot 311. The inner sides are two opposite sides in the accommodating area. The first edge 513 and the second edge 514 are opposite to each other. When the positioning column 220 is locked and fixed to the stud, a certain space is reversed between a head of the positioning column 220 and a top of the stud, so that the buckle slot 311 abuts against the aforementioned space. In other embodiments, the buckle slot 311 may further be provided with an inner groove (unlabeled). When the positioning column 220 is locked and fixed to the stud, the inner groove abuts against part of an outer edge of the positioning column 220. When the quick release hook 300 abuts against the positioning column 220, the buckle slot 311 can prevent the loosening of the positioning column 220.

The other two edges of the slide piece 310 each are provided with an oblong hole. The two oblong holes are parallel to each other and extend from the first edge 513 towards the second edge 514, respectively, as shown in FIG. 3. In this embodiment, oblong holes may be provided in other sides of the first guide block 411 and the second guide block 412. The following is a unified description that the two oblong holes of the slide piece 310 are provided below the first guide block 411 and the second guide block 412. In order to facilitate the description of the two oblong holes and the two guide blocks, the oblong hole corresponding to the first guide block 411 is referred to as a first oblong hole 312, and the oblong hole corresponding to the second guide block 412 is referred to as a second oblong hole 313.

In some embodiments, bottom sides of the first guide block 411 and the second guide block 412 each are provided with a positioning component 421. When the slide piece 310 is arranged on a bottom side of the heat dissipation unit 400, the two positioning components 421 penetrate the first oblong hole 312 and the second oblong hole 313, respectively. The positioning component 421 may be, but is not limited to, a screw, or a slide rail. In FIG. 2, the two positioning components 421 are exemplified as screws. In other embodiments, the screws may be replaced with rivets, dowels, or the like for carrying the slide piece 310 on a bottom of the heat dissipation unit 400. The positioning component 421 can move in the oblong hole.

A pressing component 320 is provided on an edge opposite to the first edge 513, and the pressing component 320 is protruding on the slide piece 310. The side of the pressing component 320 opposite to the first side 511 is referred to as a second side 512. The second side 512 may optionally be provided with an opening, and in FIG. 3 and FIG. 4B, an opening (unlabeled) being provided in the second side 512 is taken as an example for illustration.

Figure 4A:
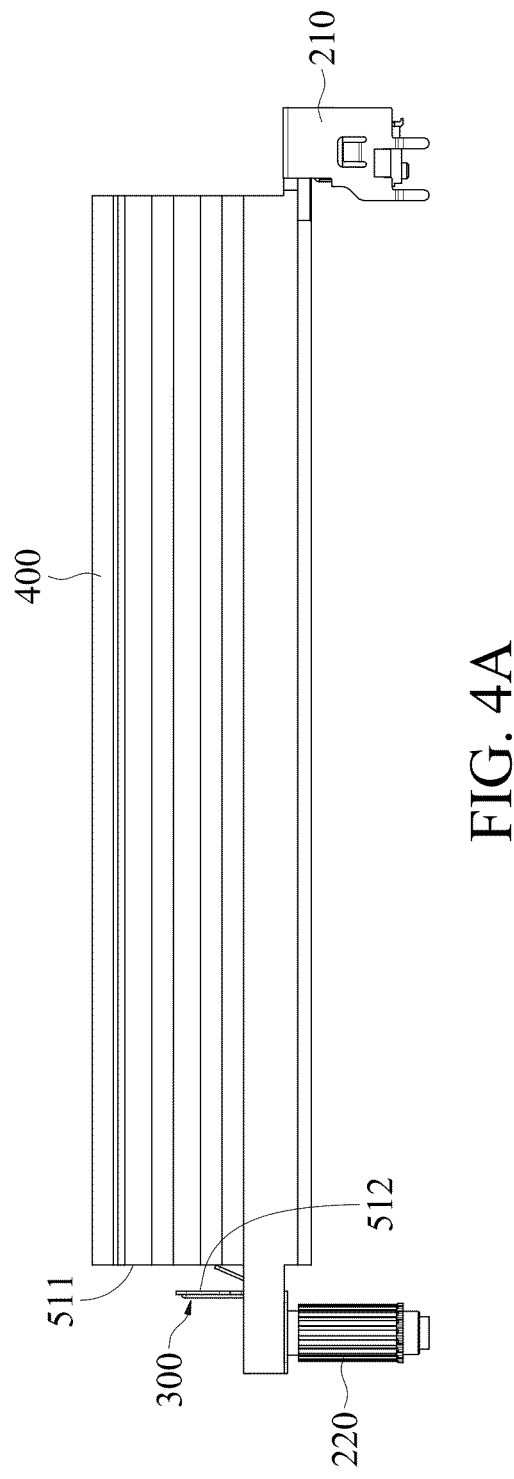
FIG. 4A is a side view of a quick release hook in a release state of an embodiment.

A width of the pressing component 320 is less than or equal to a width of the accommodating area. The pressing component 320 is arranged in the accommodating area when the two positioning components 421 penetrate the two oblong holes, as shown in FIG. 4A. In general, a height of the pressing component 320 is at least higher than a height of the first guide block 411 and the second guide block 412. If a width of the accommodating space is sufficient, a height of the pressing component 320 can be less than the height of the first guide block 411 and the second guide block 412, so that a user can touch the pressing component 320.

If the height of the pressing component 320 is higher than the height of the first guide block 411 and the second guide block 412, a wide press plate (unlabeled) may be selectively provided on a top of the pressing component 320. The wide press plate is arranged above the height of the pressing component 320 higher than the two guide blocks, as shown in FIG. 3 and FIG. 4A. A width of the wide press plate is greater than the width of the accommodating area, so that two opposite edges of the wide press plate are located on top sides of the first guide block 411 and the second guide block 412.

The spring component 330 has a first end (unlabeled) and a second end (unlabeled). The first end is provided at the second edge 514 of the slide piece 310. The second end of the spring component 330 extends beyond the second edge 514. In other words, the second end of the spring component 330 is located between the first side 511 and the second side 512. The spring component 330 is compressed or released both between the first side 511 and the second side 512. The head of the positioning component 421 is larger than an aperture of the oblong hole, so that the slide piece 310 can be arranged on the bottom side of the heat dissipation unit 400 by the positioning component 421.

In some embodiments, from FIG. 1 to FIG. 4E, the spring component 330 takes the tongue as an example. The first end of the spring component 330 extends from the second edge 514 to the outside of the slide piece 310 and extends upward. Therefore, the second end of the spring component 330 will extend beyond the second edge 514. In general, the second end of the spring component 330 is located between the first side 511 and the second side 512 of the heat dissipation unit 400, as shown in FIG. 4A, FIG. 4B, and FIG. 4C.

In order to facilitate the description of different operating states and positions of the spring component 330, reference is made to FIG. 4A, FIG. 4B, FIG. 4C, FIG. 4D, FIG. 4E, FIG. 5A and FIG. 5B. When the user presses the pressing component 320 to compress the spring component 330, the state of the spring component 330 at this time is referred to as a compress state, and the state of the spring component 330 when released is referred to as a release state. The position where the first oblong hole 312 and the second oblong hole 313 are closest to the second side edge 514 is referred to as a first position 521. The position where the first oblong hole 312 and the second oblong hole 313 are closest to the first side edge 513 is referred to as a second position 522, referring to FIG. 4E.

Figure 4B:
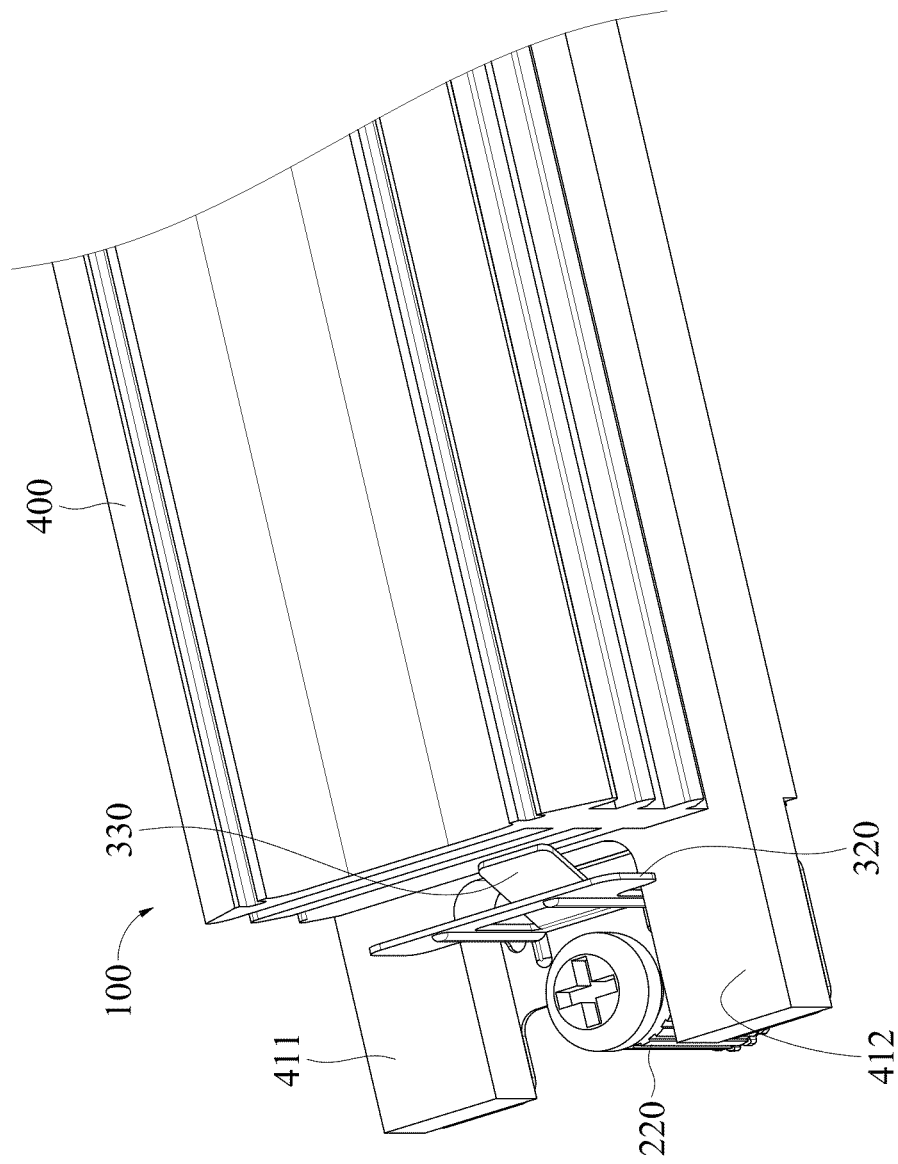
FIG. 4B is a three-dimensional view of a quick release hook in a release state of an embodiment.
Figure 4C:
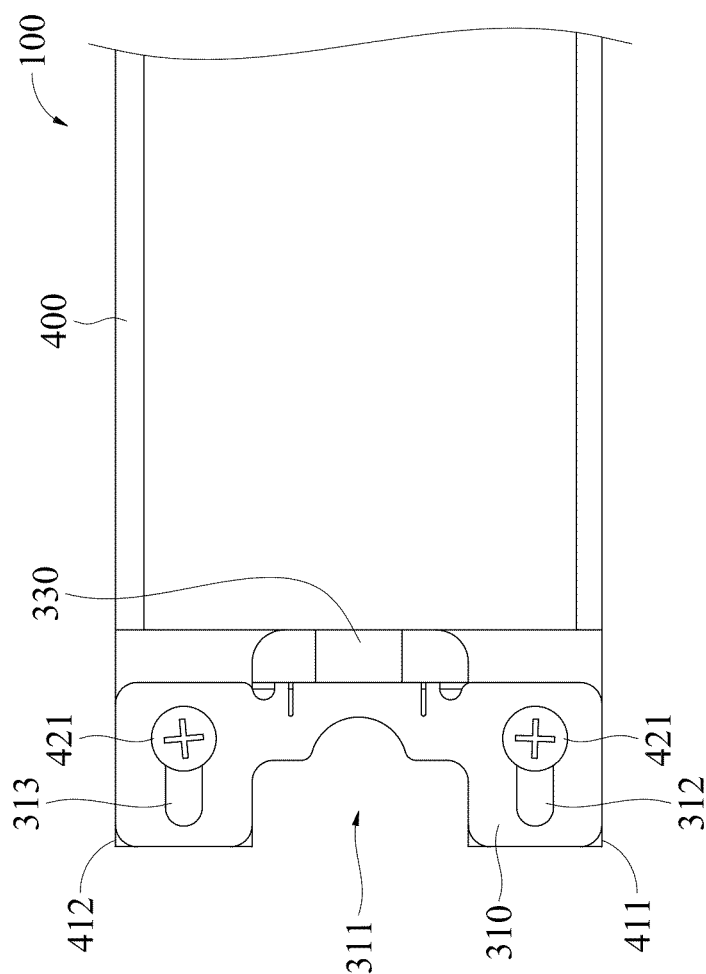
FIG. 4C is a schematic diagram of a quick release hook in a release state of an embodiment.
Figure 4D:
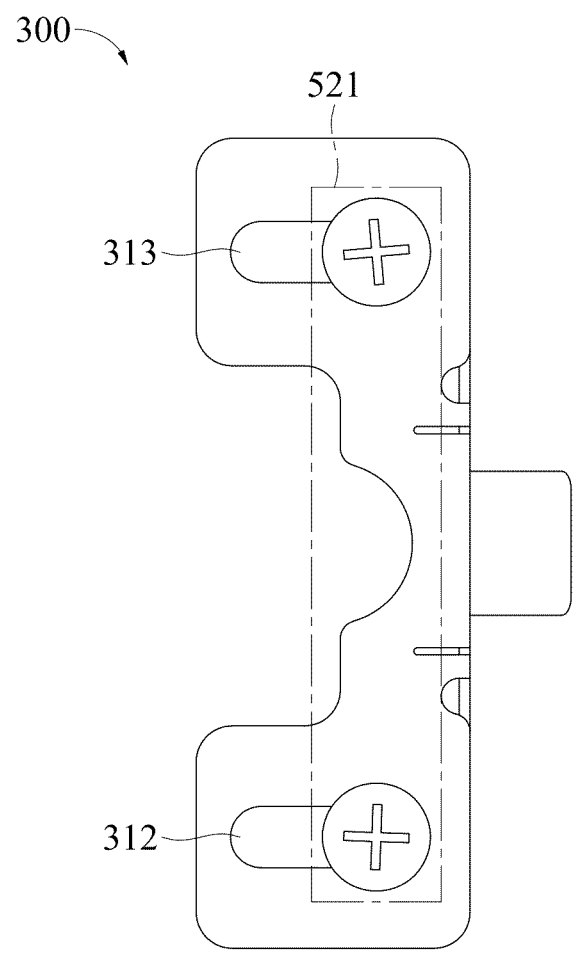
FIG. 4D is a schematic diagram of a first position of a quick release hook of an embodiment.
Figure 4E:
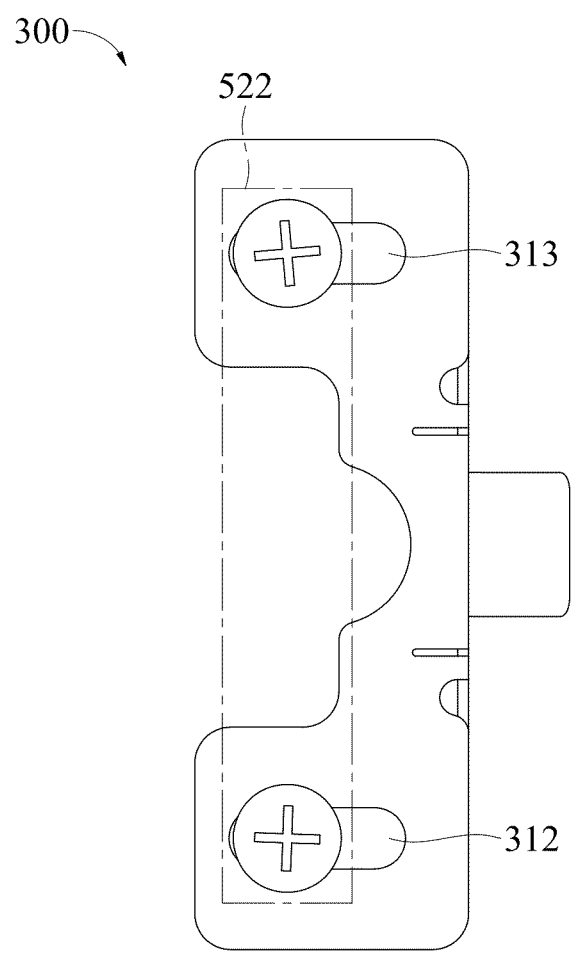
FIG. 4E is a schematic diagram of a second position of a quick release hook of an embodiment.
Figure 5A:
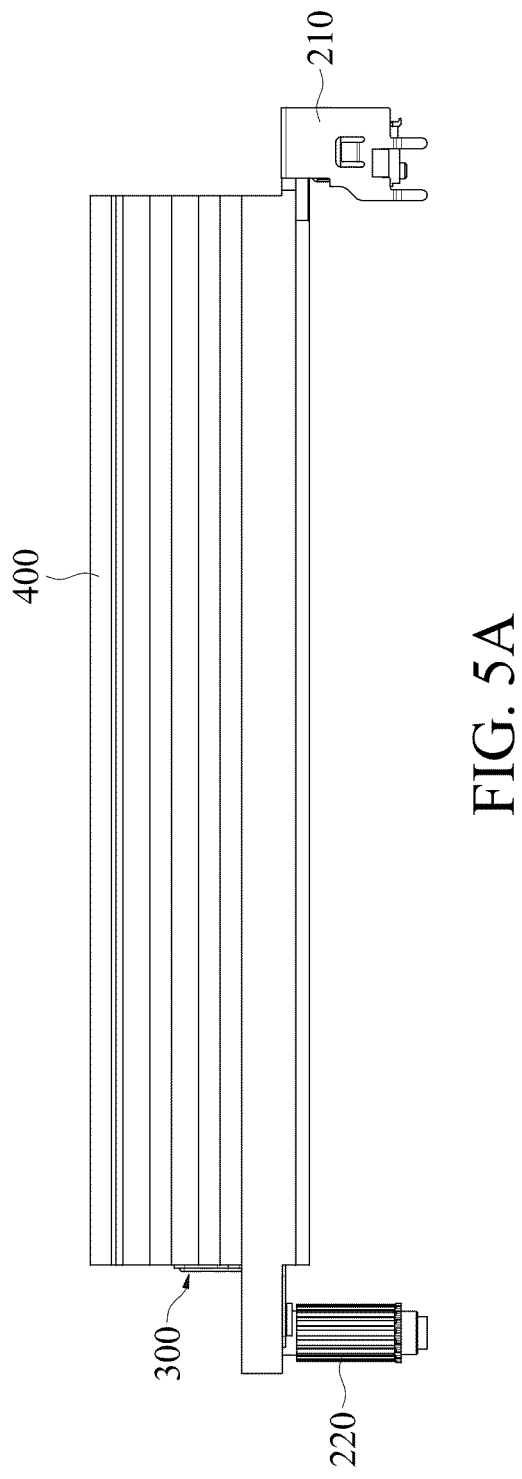
FIG. 5A is a side view of a quick release hook in a compress state of an embodiment.
Figure 5B:
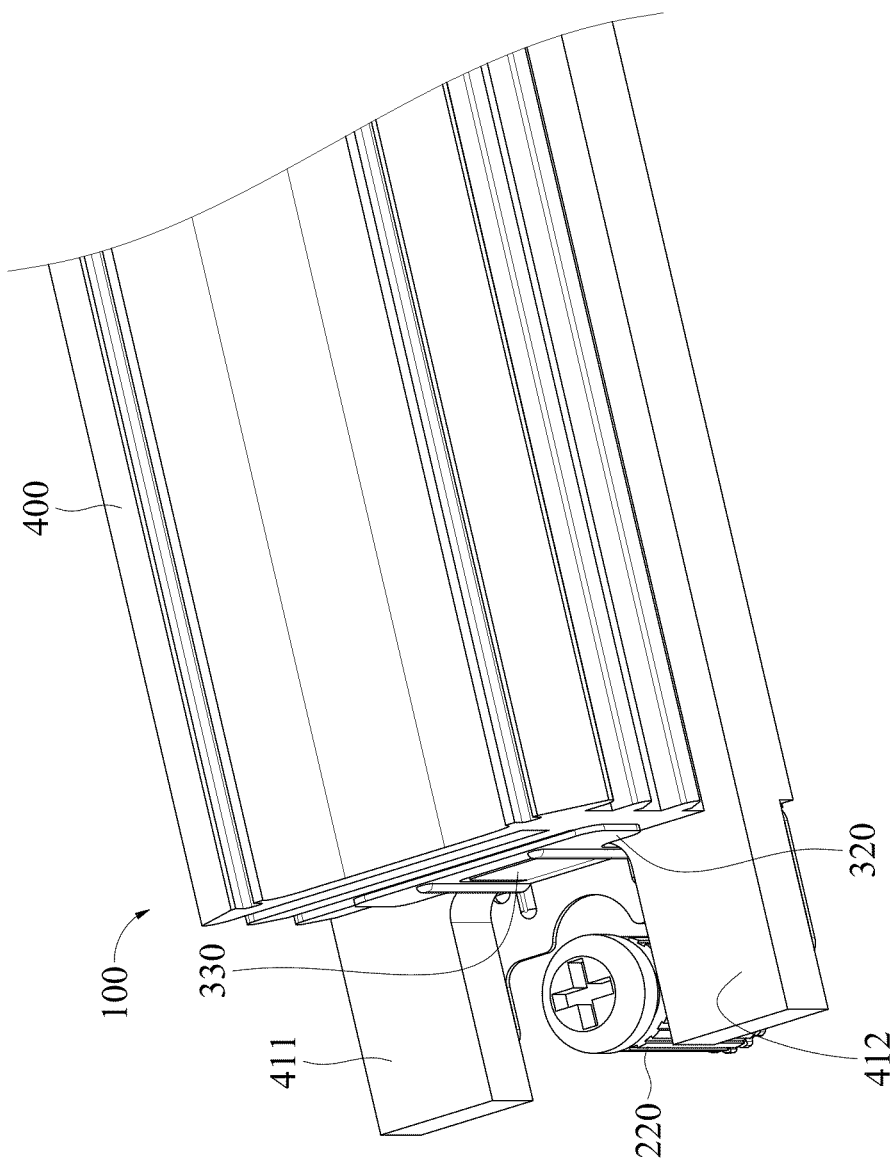
FIG. 5B is a three-dimensional view of a quick release hook in a compress state of an embodiment.

When the positioning component 421 is located in the first position 521, the spring component 330 is in the release state, referring to FIG. 4C and FIG. 4D. When the spring component 330 is in the compress state, the two positioning components 421 are located at the second position 522 of the first oblong hole 312 and the second oblong hole 313, as shown in FIG. 4E, FIG. 5A and FIG. 5B. When the spring component 330 changes from the release state to the compress state, the buckle slot 311 will move away from the positioning column 220, and the second end of the spring component 330 abuts against the first side 511, so that the elastic potential energy of the spring component 330 is accumulated. If the spring component 330 changes from the compress state to the release state, the second end of the spring component 330 abuts against the first side 511, and the release of the elastic potential energy causes the slide piece 310 to move and drive the buckle slot 311 toward the positioning column 220, as shown in FIG. 4A and FIG. 4B.

Figure 5C:
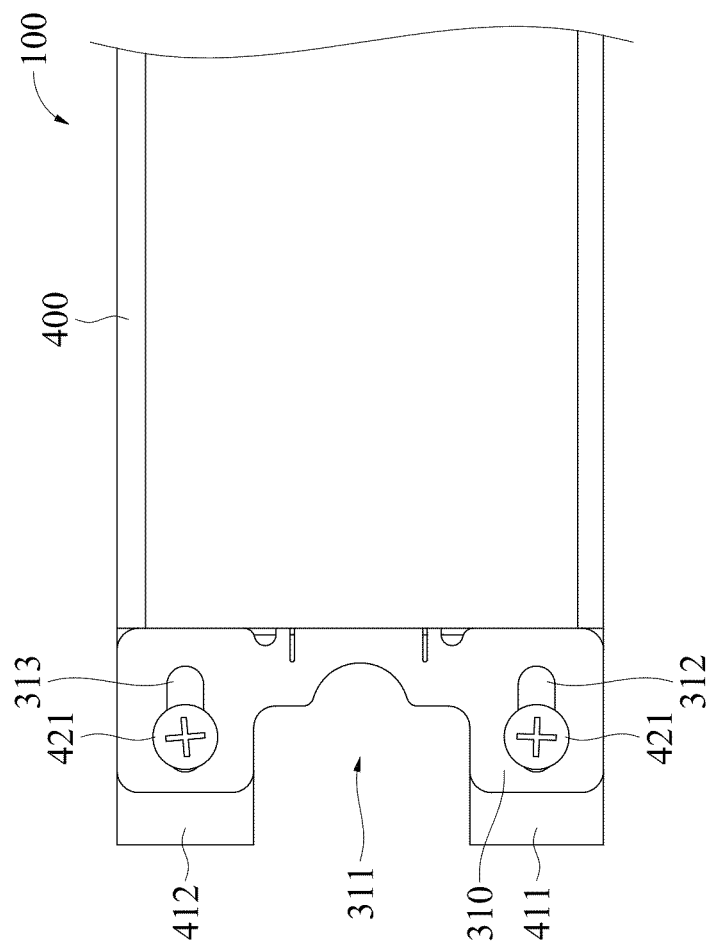
FIG. 5C is a schematic diagram of a quick release hook in a compress state of an embodiment.

After the user installs one end of the expansion card 100 to the expansion slot 210, the user can put the finger against the pressing component 320 of the other end of the expansion card 100. When the pressing component 320 is pushed, the positioning component 421 is moved from the first position 521 to the second position 522. Therefore, the spring component 330 will be compressed. At the same time, the buckle slot 311 will also move toward the first side 511. When the spring component 330 is in the compress state, the second end of the spring component 330 will be pressed by the first side 511 and move towards the pressing component 320, as shown in FIG. 5A, FIG. 5B, and FIG. 5C. The buckle slot 311 moves in a direction from the first edge 513 to the second edge 514, as shown in FIG. 4B and FIG. 5B. The user can move the buckle slot 311 downwardly along the head of the positioning column 220.

When the other end of the expansion card 100 (i.e., the side of the pressing component 320) reaches the stud of the positioning column 220, the user can release the pressing component 320 to complete the installation of the expansion card 100 to the expansion slot 210. During the process of the user releasing the pressing component 320, the spring component 330 is switched from the compress state to the release state. When the spring component 330 is in the release state, the spring component 330 drives the slide piece 310 to move along a path of the first oblong hole 312 and the second oblong hole 313, so that the buckle slot 311 abuts against the outer edge of the positioning column 220, as shown in FIG. 4B.

Figure 6A:
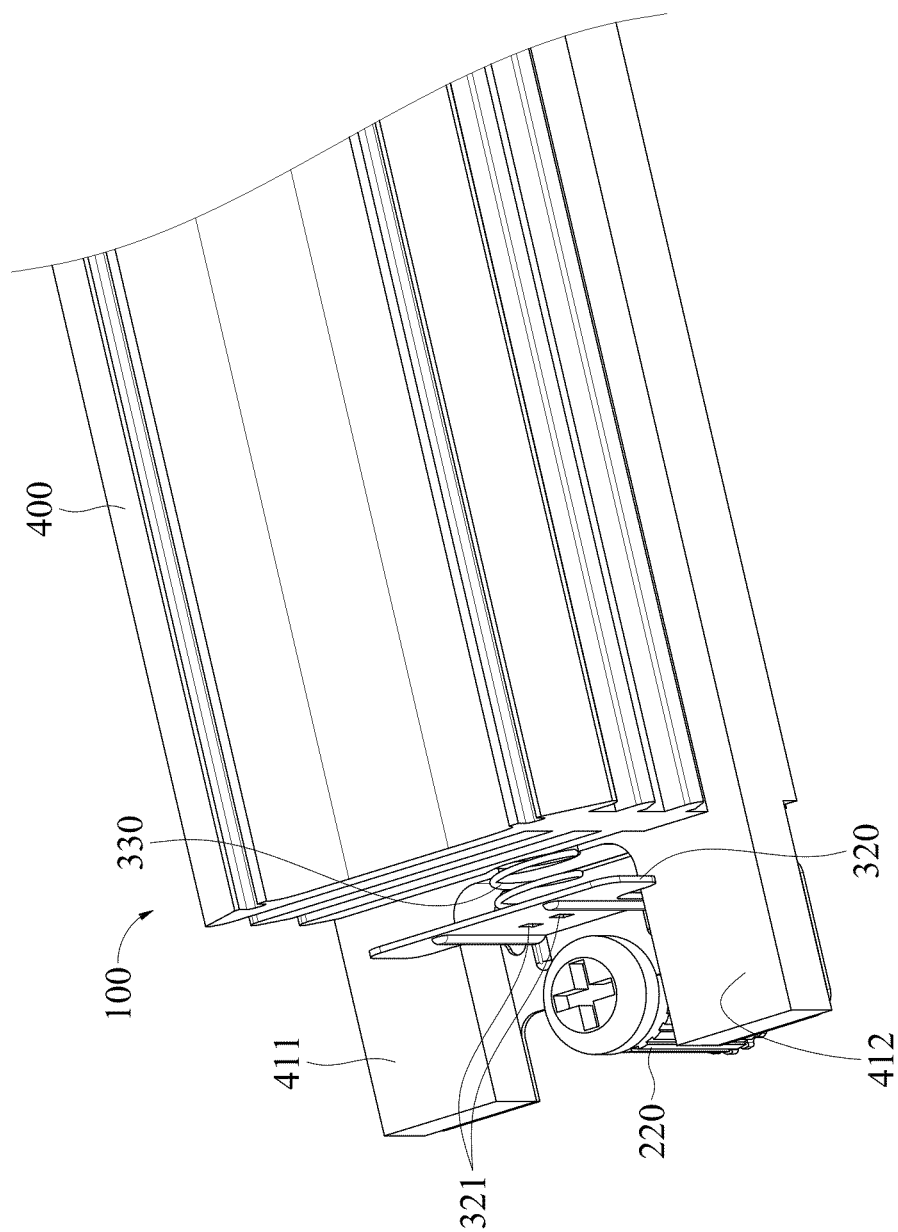
FIG. 6A is a three-dimensional view of a quick release hook and a heat dissipation unit of an embodiment.
Figure 6B:
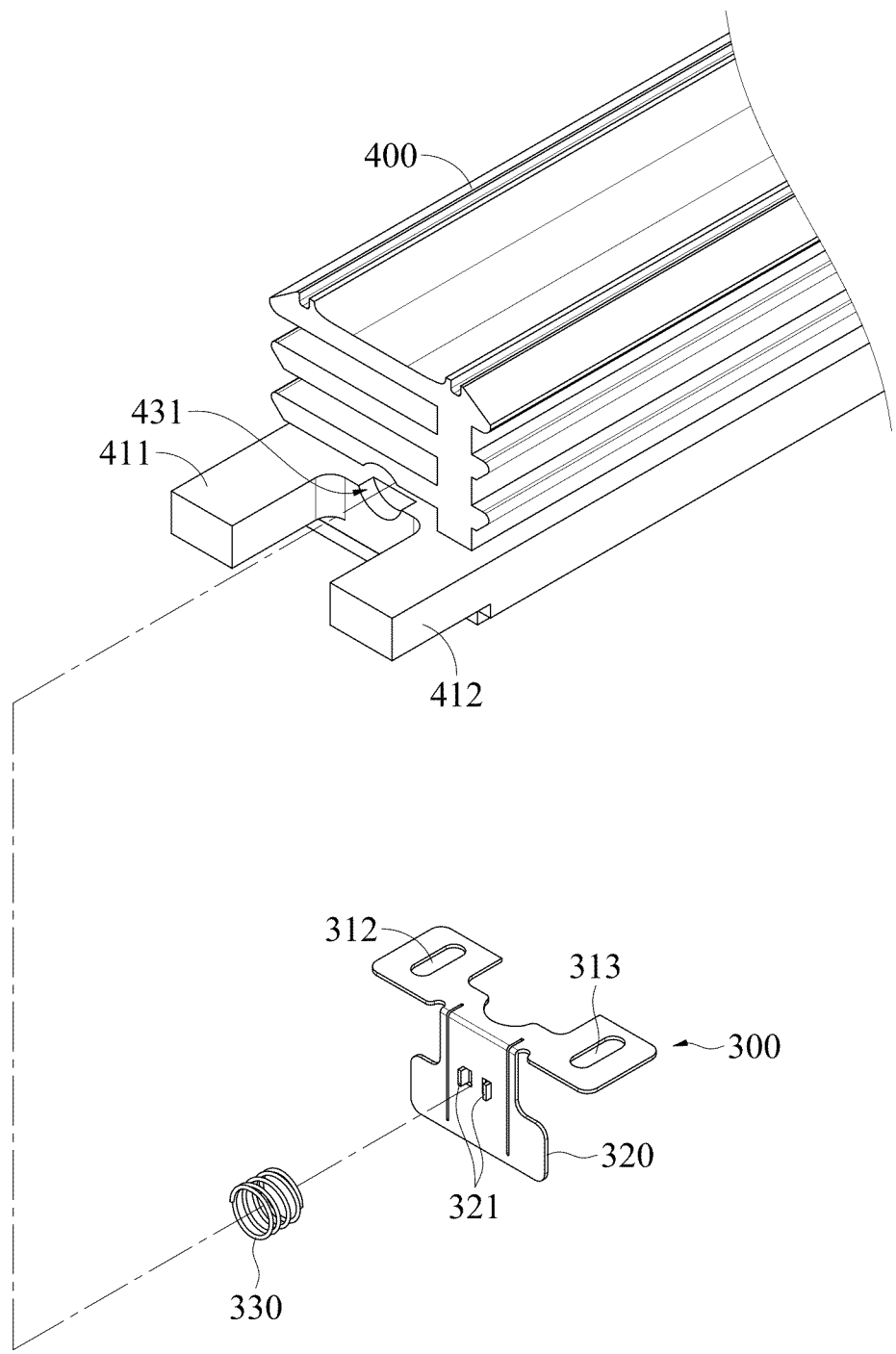
FIG. 6B is a schematic diagram of a heat dissipation unit and an opening thereof of an embodiment.

In some embodiments, the first side 511 of the heat dissipation unit 400 is provided with an accommodating hole 431, and at least two fixed contacts 321 are provided in the second side 512 of the pressing component 320, referring to FIG. 6A and FIG. 6B. The spring component 330 may be a spring or a sponge in addition to the aforementioned tongue. In FIG. 6A, a spring is shown. One end of the spring component 330 is fixed to the fixed contact 321, and the other end of the spring component 330 is provided in the accommodating hole 431. A depth of the accommodating hole 431 is based on a length of the spring component 330 in the compress state.

When the user presses against the pressing component 320, the pressing component 320 will compress the spring component 330, so that the spring component 330 is switched from the release state to the compress state. The buckle slot 311 will also move with the slide piece 310 towards the first side 511. When the spring component 330 is in the compress state, the spring component 330 is accommodated in the accommodating hole 431. When the user installs the expansion card 100 to the expansion slot 210, since the spring component 330 is in the compress state, there is no interference between the buckle slot 311 and the positioning column 220. After the user finishes the installation of the expansion card 100, the user can release the pressing component 320. When the user releases the pressing component 320, the spring component 330 is switched from the compress state to the release state. The spring component 330 will move along the accommodating hole 431, the first oblong hole 312 and the second oblong hole 313, and drive the buckle slot 311 to abut against an outer edge of the positioning column 220, as shown in FIG. 6A.

In some embodiments, the quick release hook 300 further includes at least two ribs. The two ribs are provided at the connection between the slide piece 310 and the pressing component 320. Referring to FIG. 6B, the two opposite edges of the pressing component 320 each are provided with one rib. The two ribs extend from a surface of the pressing component 320 and in a direction from the second edge 514 to the first edge 513 on the slide piece 310, providing connection strength between the pressing component 320 and the slide piece 310.

Figure 7A:
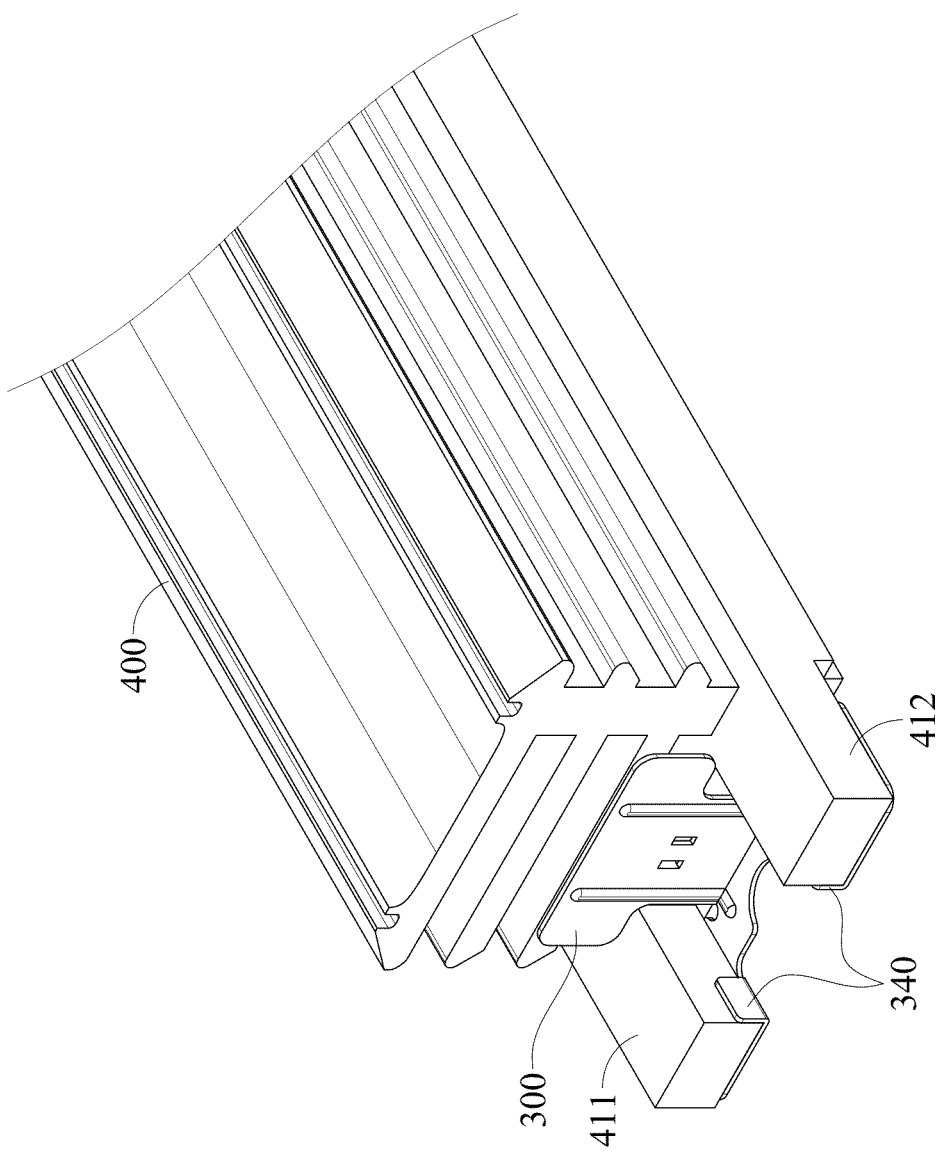
FIG. 7A is a three-dimensional view of a quick release hook and a heat dissipation unit of an embodiment.
Figure 7B:
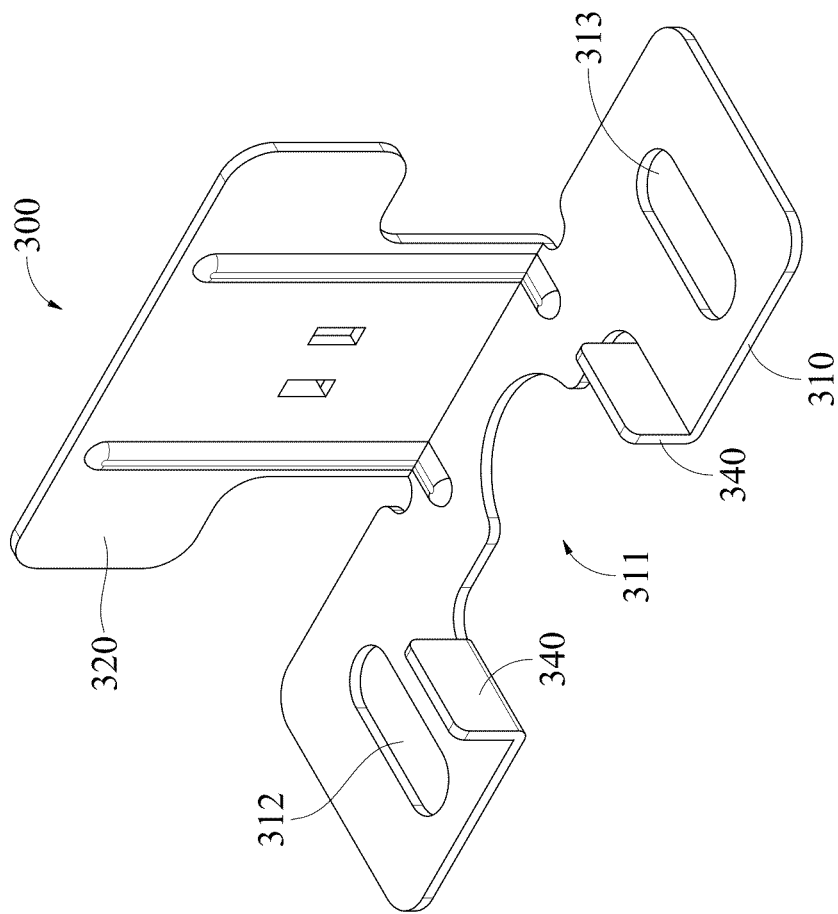
FIG. 7B is a schematic diagram of a quick release hook and fixed contacts thereof of an embodiment.

In some embodiments, the quick release hook 300 further includes two inner side plates 340, referring to FIG. 7A and FIG. 7B. Two opposite edges of the buckle slot 311 each are provided with an inner side plate 340, the inner side plates 340 extend along a normal line of the slide piece 310, and the two inner side plates 340 are parallel to each other. When the quick release hook 300 is arranged in the heat dissipation unit 400, one of the inner side plates 340 is located on an inner side of the first guide block 411, while the other inner side plate 340 is located on an inner side of the second guide block 412. The aforementioned inner sides are two opposite sides between the first guide block 411 and the second guide block 412. When the slide piece 310 is moved between the first position 521 and the second position 522, the two inner side plates 340 can prevent the slide piece 310 from shifting horizontally as it moves.

Figure 8:
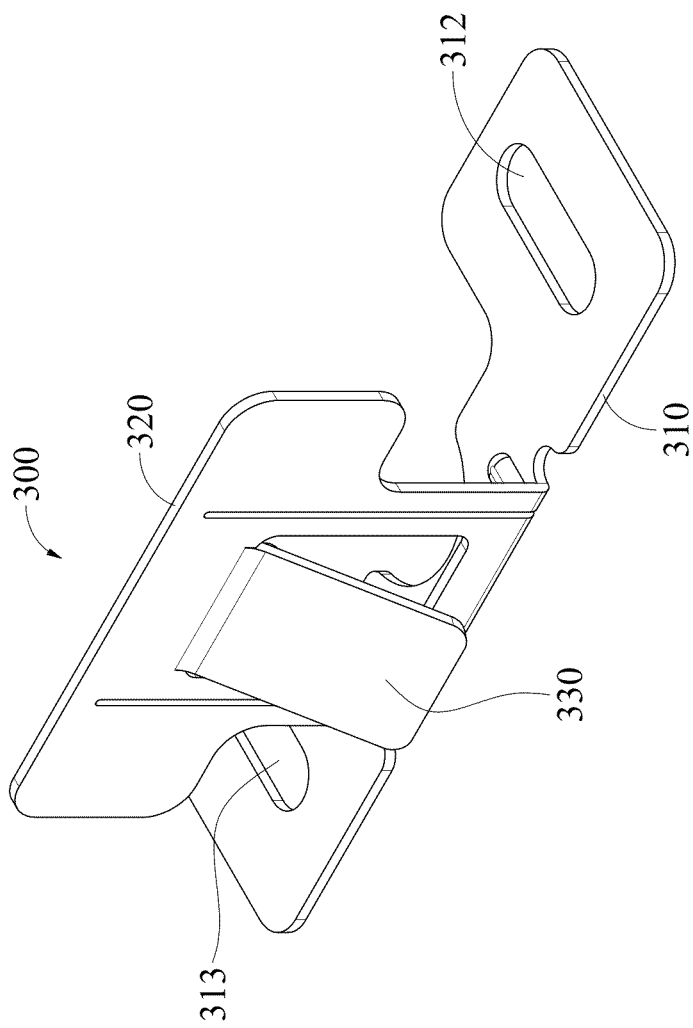
FIG. 8 is a three-dimensional view of a quick release hook of an embodiment.

In some embodiments, a first end of the spring component 330 is provided on the pressing component 320, and a second end of the spring component 330 extends beyond an outer edge of the second edge 514, referring to FIG. 8. The spring component 330 is still illustrated by taking a tongue as an example, but the spring component 330 may be replaced with the aforementioned spring or another material with stored elastic potential energy according to the aforementioned embodiments. When the user presses against the pressing component 320, the pressing component 320 pulls the slide piece 310 in a direction of the first side 511. After the spring component 330 contacts with the first side 511, the spring component 330 will be switched from the release state to the compress state. After the user finishes the installation of the expansion card 100, the user can release the pressing component 320. When the pressing component 320 is released, the spring component 330 will be switched from the compress state to the release state. The second end of the spring component 330 abuts against the first side 511 and releases the elastic potential energy, so that the slide piece moves in a direction from the second edge 514 to the first edge 513 and drives the buckle slot 311 to abut against an outer edge of the positioning column 220.

In some embodiments, the spring component 330 may be composed of a magnetic component (unlabeled). As shown in FIG. 6A and FIG. 6B, an accommodating hole 431 is provided in the first side 511 of the heat dissipation unit 400, and at least two fixed contacts 321 are provided in the second side 512 of the pressing component 320. The accommodating hole 431 is provided with a first magnetic component (unlabeled), and the fixed contacts 321 are provided with a second magnetic component (unlabeled). Opposite sides of the first magnetic component and the second magnetic component have the same magnetic property.

When the user presses against the pressing component 320 to move, a spacing distance between the first magnetic component and the second magnetic component is also shortened, thus realizing the compress state as in the case of the spring component 330. When the user releases the pressing component 320, the slide piece 310 is driven to abut against the positioning column 220 under repulsion of same magnetic property of the first magnetic component and the second magnetic component.

Figure 9:
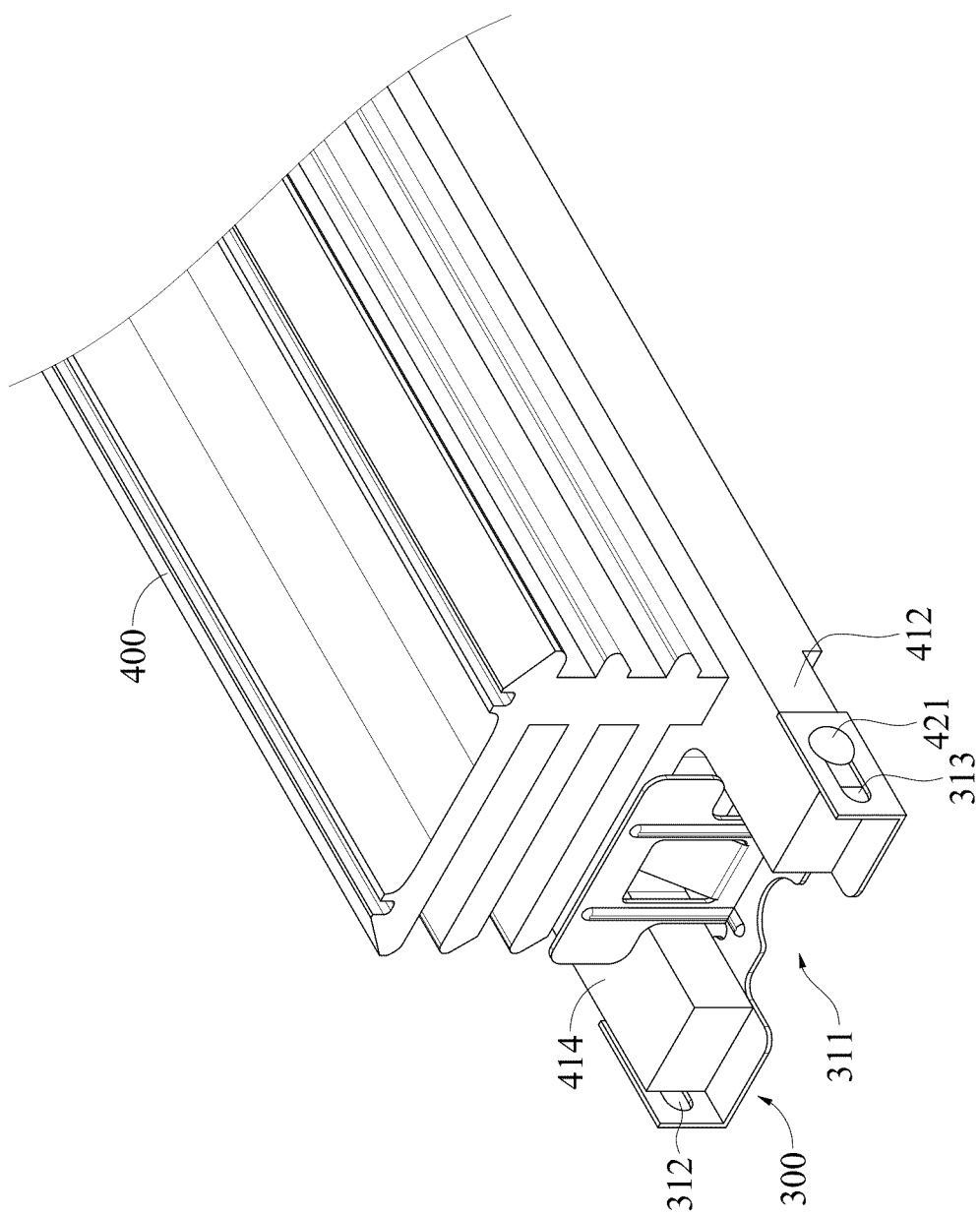
FIG. 9 is a three-dimensional view of a quick release hook of an embodiment.

In some embodiments, the two oblong holes 312, 313 of the slide piece 310 may also be arranged on other sides of the two guide blocks 411, 412. In addition, the two positioning components 421 may also be provided at corresponding positions of the two guide blocks 411, 412. For example, the positioning components 421 are arranged outside opposite exterior sides of the first guide block 411 and the second guide block 412. Therefore, the slide piece 310 can extend outwardly from the bottom side of the two guide blocks 411, 412 to the exterior sides, referring to FIG. 9. The two positioning components 421 penetrates the first oblong hole 312 and the second oblong hole 313 respectively, so that the slide pieces 310 can be arranged on the exterior sides of the two guide blocks 411, 412.

Figure 10:
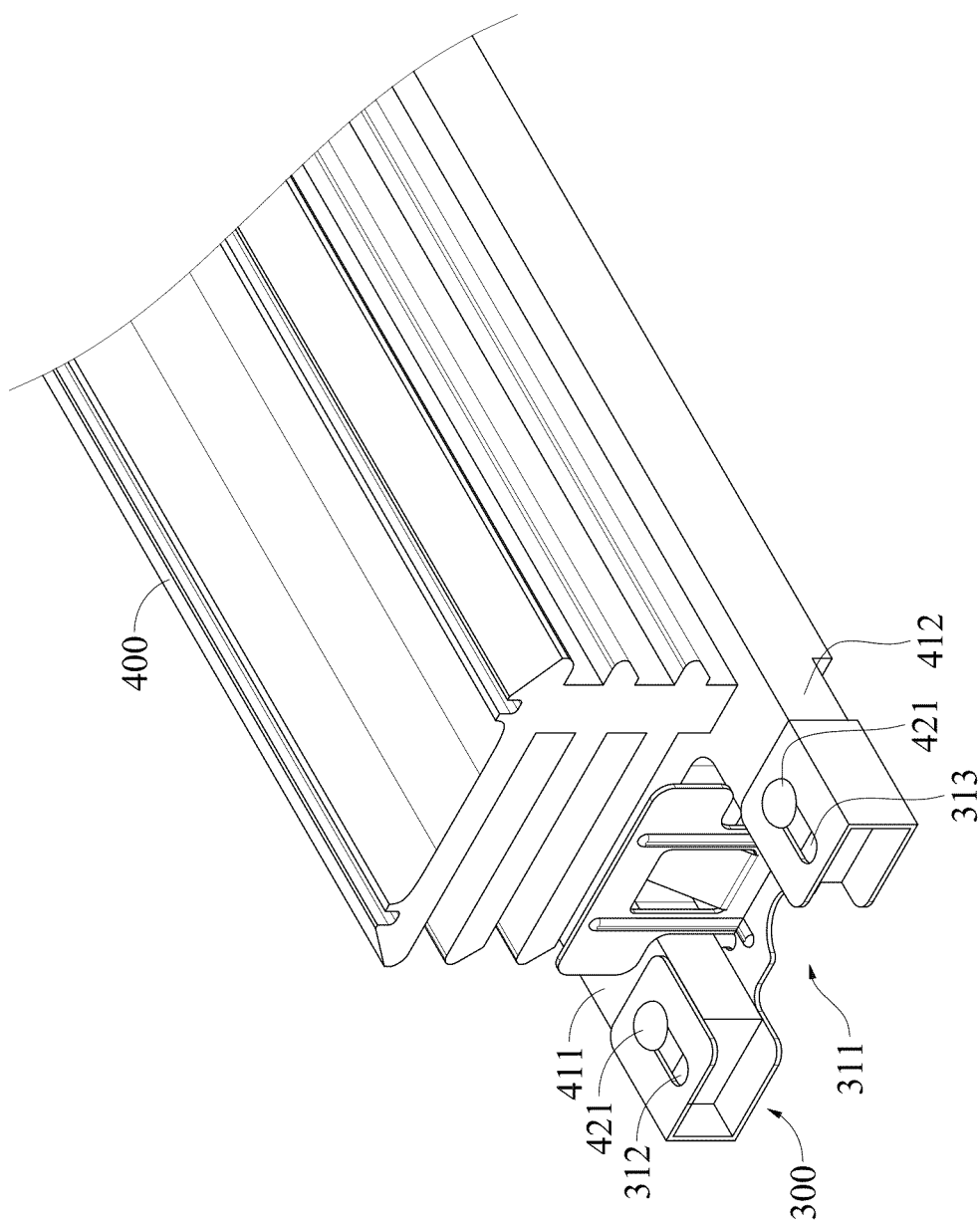
FIG. 10 is a three-dimensional view of a quick release hook of an embodiment.

In addition to arranging the slide pieces 310 on the exterior sides of the first guide block 411 and the second guide block 412, the first oblong hole 312 and the second oblong hole 313 may also be arranged in top sides or inner sides of the first guide block 411 and the second guide block 412, referring to FIG. 10.

Figure 11A:
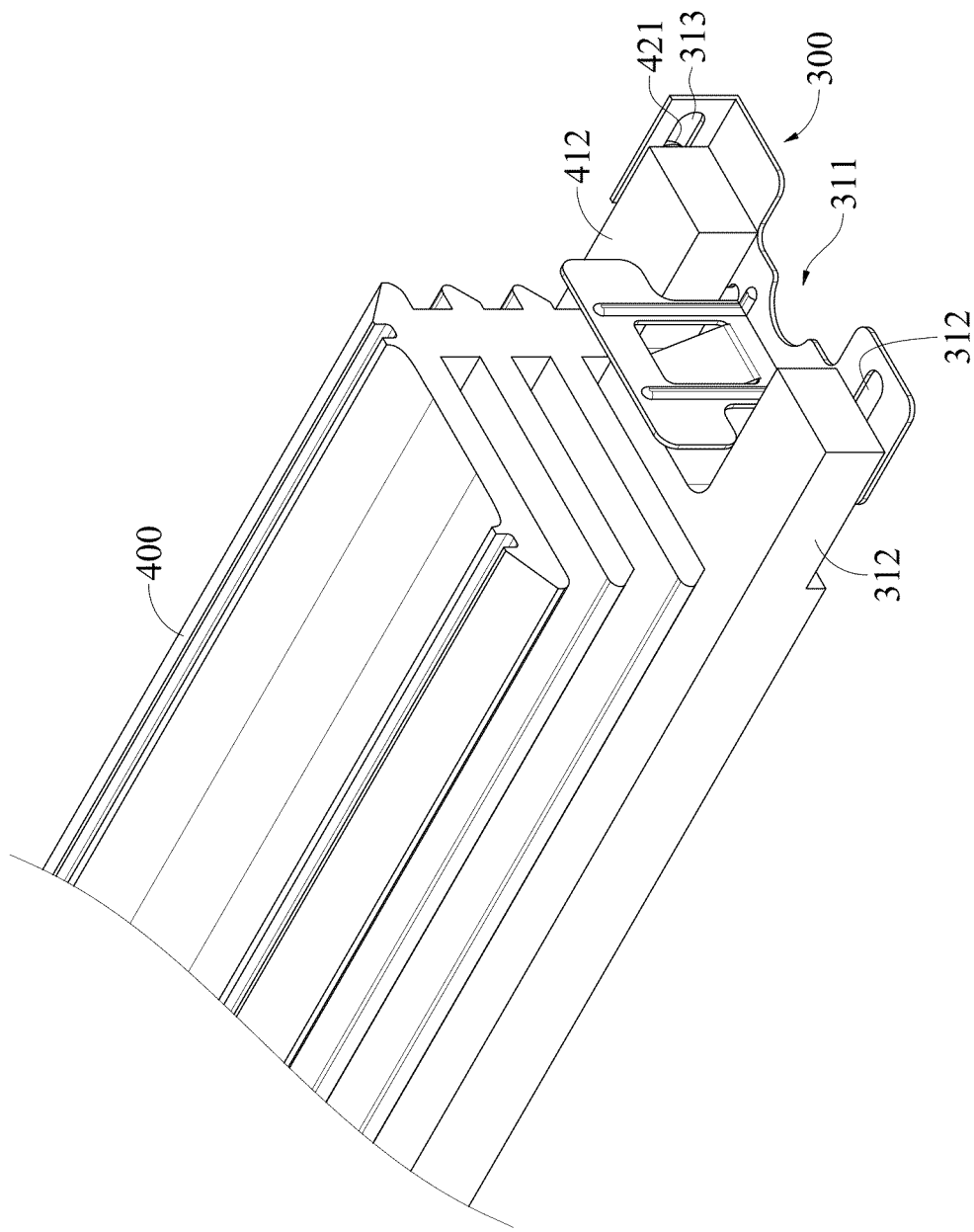
FIG. 11A is a three-dimensional view of a quick release hook of an embodiment.
Figure 11B:
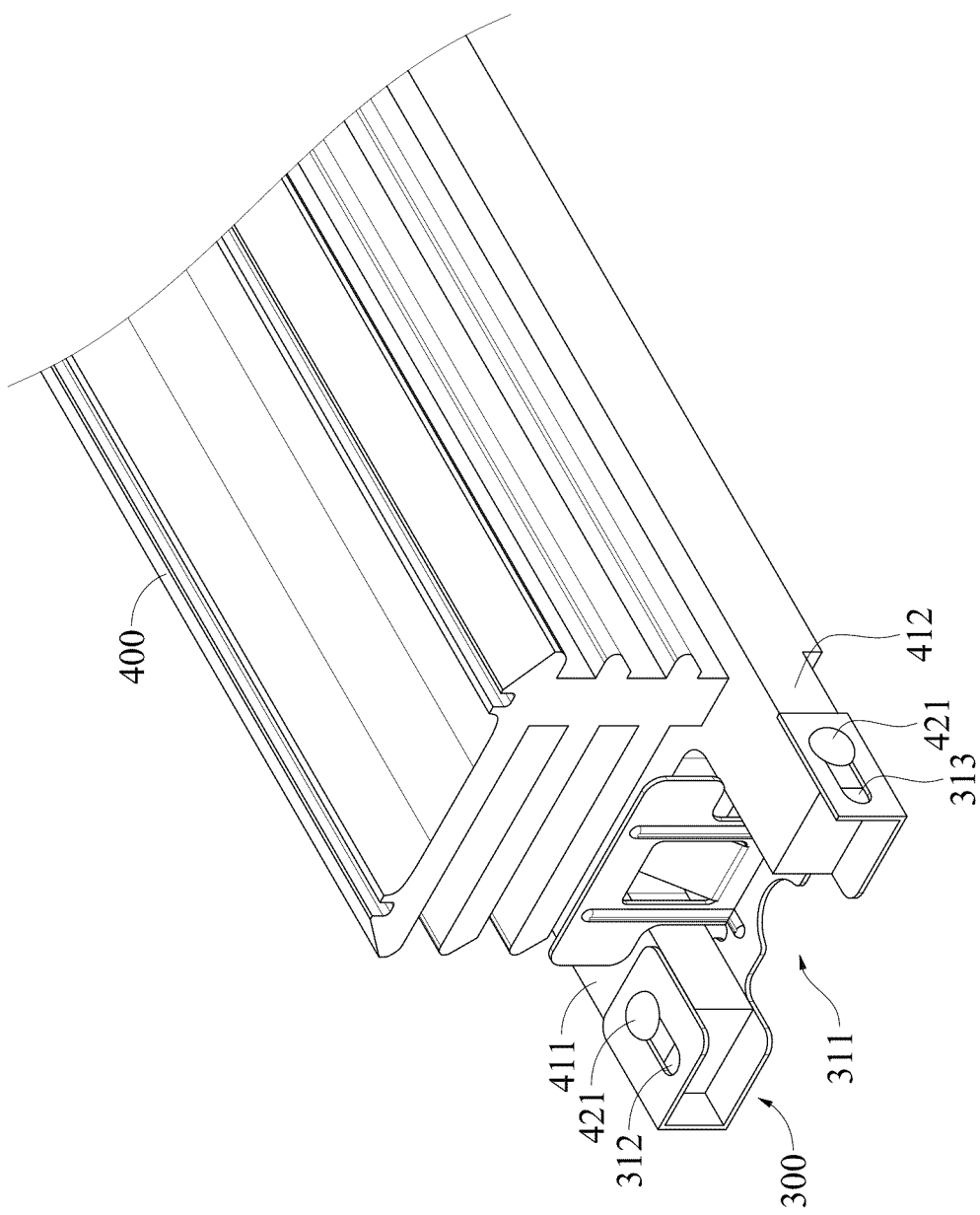
FIG. 11B is a three-dimensional view of a quick release hook of an embodiment.

Further, the side of the first guide block 411 corresponding to the first oblong hole 312 may be different from the side of the second guide block 412 corresponding to the second oblong hole 313. For example, the first oblong hole 312 is provided in the bottom side of the first guide block 411, while the second oblong hole 313 can be provided in the exterior side of the second guide block 412, as shown in FIG. 11A. Alternatively, the first oblong hole 312 is provided in the exterior side of the first guide block 411, while the second oblong hole 313 is provided in the top side of the second guide block 412, as shown in FIG. 11B.

Figure 12:
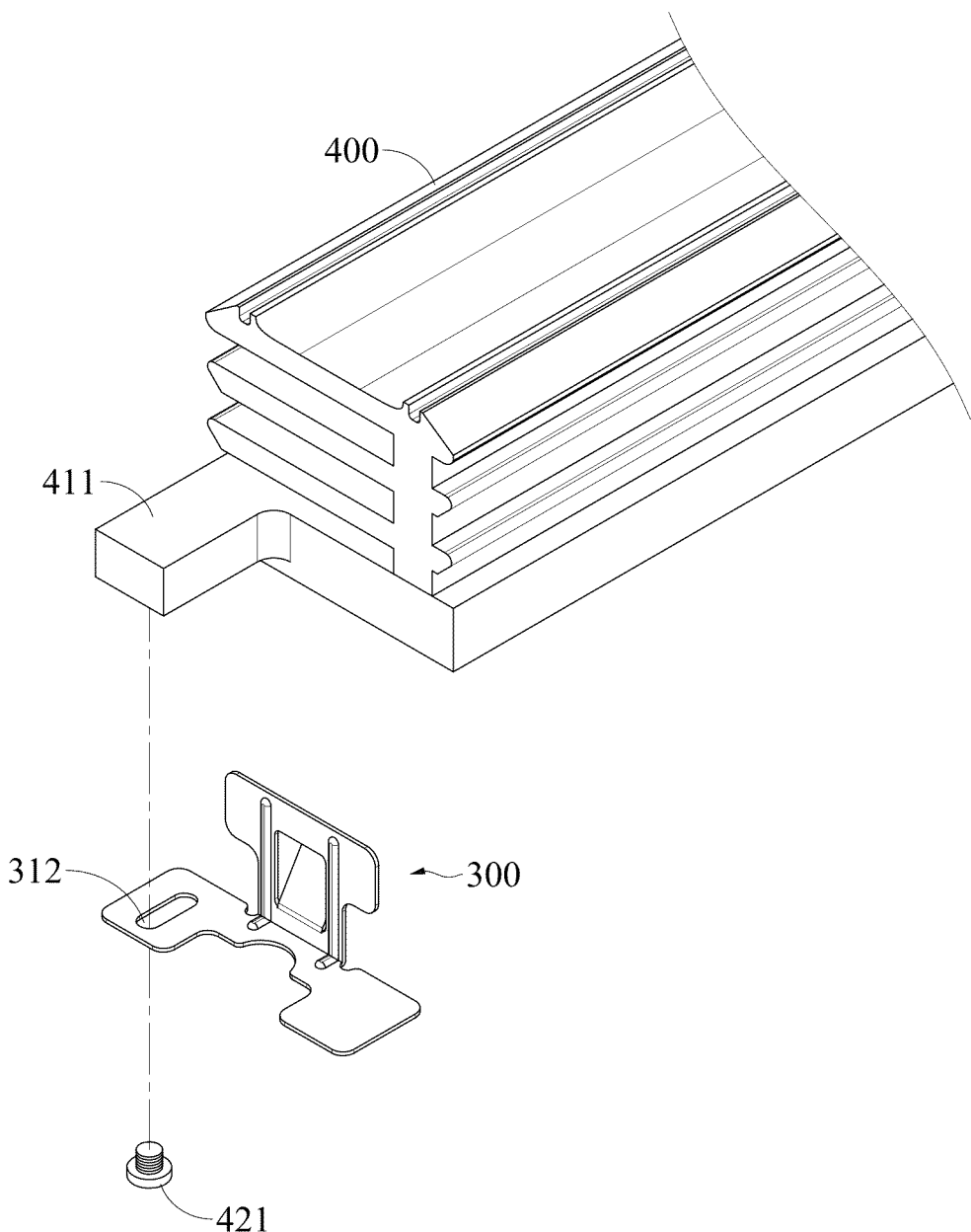
FIG. 12 is a three-dimensional view of a quick release hook and a heat dissipation unit of an embodiment.

In some embodiments, the expansion card 100 includes a circuit board 110, a quick release hook 300 and a heat dissipation unit 400, referring to FIG. 12. The first guide block 411 is provided on the first side 511 of the heat dissipation unit 400, and the first guide block 411 protrudes from the first side 511. The positioning component 421 is provided in any side of the first guide block 411. In FIG. 12, the positioning component 421 is provided on the bottom side of the first guide block 411.

The quick release hook 300 includes the slide piece 310, the pressing component 320, and the spring component 330.

The slide piece 310 includes the first edge 513, the second edge 514, and the first oblong hole 312. The first edge 513 and the second edge 514 are opposite to each other. The first edge 513 of the slide piece 310 is provided with the buckle slot 311. One edge of the slide piece 310 is provided with a first oblong hole 312. The first oblong hole 312 extends from the first edge 513 towards the second edge 514. The first oblong hole 312 is provided in the bottom side of the first guide block 411. The first guide block 411 is provided with the positioning component 421. The positioning component 421 penetrates the first oblong hole 312, so that the slide piece 310 is provided on the bottom side of the heat dissipation unit 400. The slide piece 310 can move along the first guide block 411.

The spring component 330 includes the first end and the second end (unlabeled). The first end is provided at the second edge 514 of the slide piece 310. The second end of the spring component 330 extends beyond the second edge 514. For the setting of the spring component 330, reference can be made to FIG. 4B, FIG. 6A or FIG. 8. When the spring component 330 is in the compress state, the positioning component 421 is located at the second position 522 of the first oblong hole 312, reference can be made to FIG. 5A and FIG. 5B. After the user finishes the installation of the expansion card 100, the user can release the pressing component 320, so that the spring component 330 is in the release state. At the same time, the buckle slot 311 can abut against the positioning column 220, and the positioning component 421 is located at the first position 521 of the first oblong hole 312.

In some embodiments, the spring component 330 may be the tongue, the spring, or the sponge. If the spring component 330 is the tongue, it can be used in conjunction with the illustration of the compress and release states of FIG. 4A, FIG. 4B, FIG. 5A, and FIG. 5B. If the spring component 330 is the spring or the sponge, the first end of the spring component 330 is provided on the second side 512 of the slide piece 310, and the second end can be provided on the first side 511, referring to FIG. 6A and FIG. 6B. When the user presses against the pressing component 320, the pressing component 320 will compress the spring component 330. The spring component 330 is switched from the release state to the compress state, so that the buckle slot 311 moves toward the first side 511. When the user releases the pressing component 320, the spring component 330 is switched from the compress state to the release state. The slide piece 310 will move between the first position 521 and the second position 522 along the first oblong hole 312 and the second oblong hole 313. In other words, the buckle slot 311 moves from the first side 511 toward the positioning column 220 and abuts against the positioning column 220.

In summary, the heat dissipation assembly with a quick release hook 300 and the electric device 10 provide a heat dissipation hook free of screw locking. Through the compression and release of the elastic potential energy of the quick release hook 300, the user can realize the installation of the quick release hook 300 and the expansion card 100 can be avoided from loosening when the quick release hook 300 abutting against the positioning column 220, thereby reducing the chance of short circuit of the main board 200 caused by the loosening of the screw.

What is claimed is:

1. A heat dissipation assembly, suitable for a positioning column fixed to a main board, the heat dissipation assembly comprising:

a heat dissipation unit, a first guide block being provided on a first side of the heat dissipation unit, and a first positioning component being provided on the first guide block; and a quick release hook, comprising a slide piece, a pressing component and a spring component, the slide piece comprising a buckle slot and a first oblong hole, the first positioning component penetrating the first oblong hole and being provided on the first guide block, such that the slide piece is arranged in the first guide block, the pressing component being protruding on the slide piece, the spring component comprising a first end and a second end, the first end being provided on the slide piece or the pressing component, and the second end extending from the first end to the first side, wherein the first guide block moves between a first position and a second position of the first oblong hole, the first guide block is located at the first position, the buckle slot abuts against the positioning column, the first guide block is located at the second position, and the second end of the spring component abuts against the first side.

2. The heat dissipation assembly according to claim 1, wherein the spring component is a tongue, a spring or a sponge.

3. The heat dissipation assembly according to claim 2, wherein an accommodating hole is provided in the first side, at least two fixed contacts are provided in a second side of the pressing component, the first end is fixed to the fixed contacts, and the second end is accommodated in the accommodating hole.

4. The heat dissipation assembly according to claim 1, wherein the buckle slot is provided on a first edge of the slide piece, the pressing component is provided on a second edge of the slide piece, and the first edge and the second edge are opposite to each other.

5. The heat dissipation assembly according to claim 1, wherein a second guide block is provided on the first side, a second positioning component is provided on the second guide block, and the second positioning component penetrates a second oblong hole and is provided on the second guide block.

6. The heat dissipation assembly according to claim 5, wherein the first guide block and the second guide block are parallel to each other.

7. The heat dissipation assembly according to claim 5, wherein two opposite inner edges of the buckle slot each are provided with an inner side plate, the two inner side plates are parallel to each other, one inner side plate is located on an inner side of the first guide block, and the other inner side plate is located on an inner side of the second guide block.

8. An electric device, suitable for installing an expansion card, comprising:

a main board, comprising an expansion slot and a positioning column, the expansion slot accommodating the expansion card;

a heat dissipation unit, provided on the expansion card, a first guide block being provided on a first side of the heat dissipation unit, and a first positioning component being provided on the first guide block; and a quick release hook, comprising a slide piece, a pressing component and a spring component, the slide piece comprising a buckle slot and a first oblong hole, the first positioning component penetrating the first oblong hole and being provided on the first guide block, such that the slide piece is arranged in the first guide block, the pressing component being protruding on the slide piece, the spring component comprising a first end and a second end, the first end being provided on the slide piece or the pressing component, and the second end extending from the first end to the first side, wherein the first guide block moves between a first position and a second position of the first oblong hole, the first guide block is located at the first position, the buckle slot abuts against the positioning column, the first guide block is located at the second position, and the second end of the spring component abuts against the first side.

9. The electric device according to claim 8, wherein the spring component is a tongue, a spring or a sponge.

10. The electric device according to claim 8, wherein an accommodating hole is provided in the first side, at least two fixed contacts are provided in a second side of the pressing component, the first end is fixed to the fixed contacts, and the second end is accommodated in the accommodating hole.

11. The electric device according to claim 8, wherein a second guide block is provided on the first side, a second positioning component is provided on the second guide block, the first guide block and the second guide block are parallel to each other, and the second positioning component penetrates a second oblong hole and is provided on the second guide block.

12. The electric device according to claim 11, wherein two opposite inner edges of the buckle slot each are provided with an inner side plate, one inner side plate is located on an inner side of the first guide block, the other inner side plate is located on an inner side of the second guide block, and the inner side of the first guide block is opposite to the inner side of the second guide block.

* * * * *